United States Patent [19]
Brombaugh et al.

[11] Patent Number: 5,774,084
[45] Date of Patent: Jun. 30, 1998

[54] METHOD AND APPARATUS FOR TRANSLATING DIGITAL DATA INTO AN ANALOG SIGNAL

[75] Inventors: Eric Martin Brombaugh, Mesa; John Michael Liebetreu; Ronald Duane McCallister, both of Scottsdale, all of Ariz.

[73] Assignee: SiCOM, Inc., Scottsdale, Ariz.

[21] Appl. No.: 627,930

[22] Filed: Apr. 3, 1996

[51] Int. Cl.$^6$ ...................................................... H03M 1/66
[52] U.S. Cl. .......................... 341/152; 344/144; 375/238
[58] Field of Search .................................... 341/144, 143, 341/152; 375/238

[56] References Cited

U.S. PATENT DOCUMENTS

| | | | |
|---|---|---|---|
| 3,836,908 | 9/1974 | Hegendorfer | 341/144 |
| 5,062,105 | 10/1991 | McKnight et al. | 370/84 |
| 5,337,338 | 8/1994 | Sutton et al. | 377/33 |

Primary Examiner—Jeffrey A. Gaffin
Assistant Examiner—Peguy JeanPierre
Attorney, Agent, or Firm—Meschkow & Gresham, P.L.C.; Lowell W. Gresham; Jordan M. Meschkow

[57] ABSTRACT

A pulse width modulation (PWM) circuit translates digital data into an analog signal. The PWM circuit includes at least a digital counter, a significance reverser, and a comparator circuit. The significance reverser reverses the relative order of significance of at least two bits in the count words generated by the counter. The comparator determines whether the magnitude of a digital input word is greater than the magnitude of the reversed order count word. The PWM circuit produces a high output when the magnitude of the input word is greater than the magnitude of the reversed order count word and a low output when the magnitude of the input word is not greater than the magnitude of the reversed order count word. The analog output produced by the PWM circuit includes a number of pulses evenly distributed during the count cycle of the counter, and the input word indicates a duty cycle for the analog output. The PWM circuit includes a programmable output gain feature and an output interface that mimics the output configuration of conventional phase/frequency detector circuits.

17 Claims, 3 Drawing Sheets

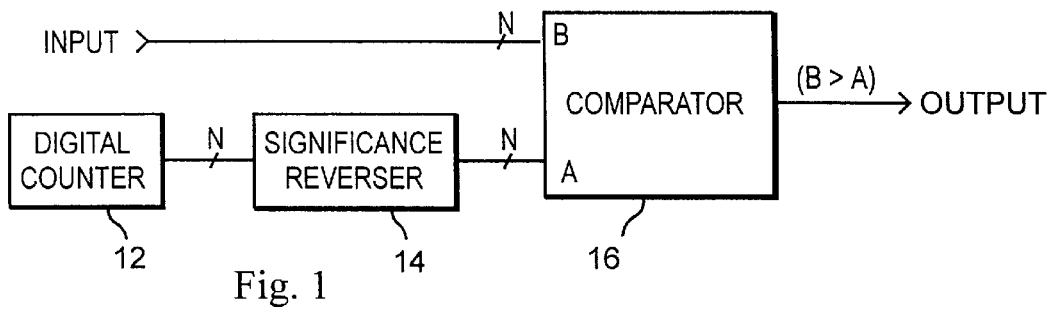
Fig. 1
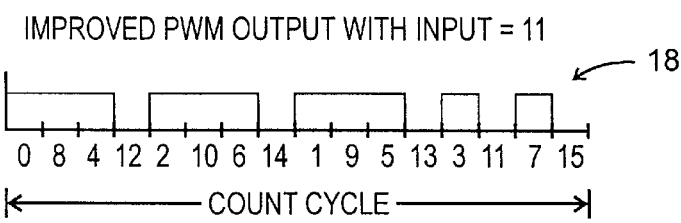
Fig. 2
Fig. 3A
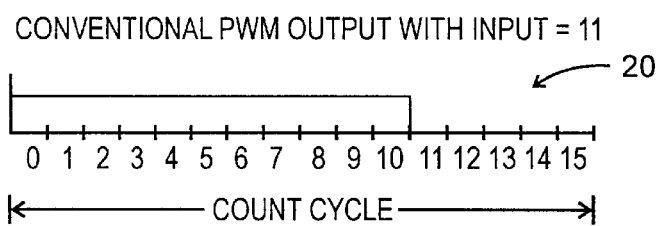
Fig. 3B
PRIOR ART

METHOD AND APPARATUS FOR TRANSLATING DIGITAL DATA INTO AN ANALOG SIGNAL

FIELD OF THE INVENTION

The present invention relates generally to digital data communication systems. More specifically, the present invention relates to digital pulse width modulators.

BACKGROUND OF THE INVENTION

Many systems employ digital circuits that control the generation of analog signals. A system may utilize such analog signals to control one or more operating parameters. For example, a digital data receiver may include an analog-controlled frequency reference in a phase locked loop circuit that is responsive to symbol tracking parameters. These parameters can be generated and/or processed digitally before being transformed into an analog control signal. Conventionally, a digital-to-analog converter (DAC) or a pulse width modulator (PWM) circuit is used to generate an analog signal from a digital word. Unfortunately, these components may not be suitable for many applications.

Stand-alone DAC circuits are typically used as an interface between digital and analog circuits because they are difficult to implement in either an all-digital circuit or an all-analog circuit. As such, stand-alone DACs are uneconomical to use in practical systems where manufacturing costs are proportional to the number of electronic components and/or the number of component interconnections. In addition, functional benefits that may be gained from the use of a discrete DAC component may be outweighed by the undesirably large physical size of the DAC and the relatively large amount of power consumed by the DAC.

PWM circuits are generally used to control the pulsewidth of an output signal. Digital PWM circuits vary the pulsewidth of the output according to the magnitude of a digital input word. Such pulsewidth control may be utilized in a digital data receiver where a symbol tracking loop regulates the frequency of a timing clock signal. The PWM output may, for example, drive a charge pump circuit that provides an analog voltage or current to a variable frequency oscillator.

Typically, a digital PWM utilizes a digital counter, a digital comparator, and output interface components. The digital counter has an associated counter cycle during which it counts from a first digital value to a last digital value. The pulse repetition rate of a conventional PWM output signal is equal to the counter cycle frequency, i.e., only one output pulse is generated during each counter cycle.

In contrast to DACs, conventional PWM circuits are relatively easy to implement in an all-digital environment. However, a conventional PWM circuit that utilizes a digital counter introduces harmonic components in the output signal at frequencies near to the counter cycle frequency of the digital counter. The frequency harmonics created by a conventional PWM circuit can adversely affect system performance if heavy filtering of the analog output signal cannot be tolerated. For example, in a digital data receiver such frequency harmonics can affect the accuracy of the symbol timing clock and can introduce unwanted errors in the decoded output data.

A typical PWM circuit produces an analog signal having a pulsewidth proportional to the magnitude of a digital input word, and only one pulse is generated during a counter cycle. An amount of transport-delay is inherent in conventional PWM circuits because an accurate determination of the input value may only be obtained after an entire counter cycle has elapsed. As such, a determination of the input value based upon a time interval shorter than the counter cycle may be substantially different than the actual input value. This source of error can prevent a system utilizing conventional PWM methodologies from quickly settling to an acceptable output level. In addition, conventional PWM circuits typically require complex filtering at the output to compensate for undesirable amounts of transport delay.

A digital data receiver can utilize a PWM circuit in a symbol tracking loop to control the symbol timing rate of the receiver after obtaining initial synchronization. In addition, the receiver may use an analog phase locked loop during an initial signal acquisition process. Typically, the symbol tracking loop is based upon a relatively high clock rate (e.g., in the megahertz range) and the analog loop is based upon a relatively low reference frequency (e.g., in the kilohertz range). Consequently, the output gain of the two loops can be considerably different, which is undesirable when the receiver switches between the two timing loops. For example, the receiver may lose synchronization when switching between loops if a large gain variation produces transients in the timing control signal.

SUMMARY OF THE INVENTION

Accordingly, it is an advantage of the present invention that an improved digital pulse width modulation (PWM) circuit is provided.

Another advantage of the present invention is that an improved method for translating digital data into an analog signal is provided.

A further advantage is that the PWM circuit is easy to implement in an all-digital circuit and economical to use in systems that process both digital and analog signals.

An additional advantage is that the improved PWM circuit generates less harmonic components near its digital counter update frequency than conventional PWM circuits.

Another advantage is that the PWM circuit produces an analog signal having an average output level that can be adequately determined early in the digital counter cycle.

A further advantage of the present invention is that the output gain of the PWM circuit is programmable to approximate the gain of an external circuit.

The above and other advantages of the present invention are carried out in one form by a PWM circuit that translates digital data into an analog signal. The PWM circuit includes a digital counter that produces count words, a significance reverser for reversing the relative order of significance of at least two of the count word bits to produce reversed order count words, and a comparator circuit. The comparator circuit compares the magnitude of the reversed order count words to the magnitude of a digital input word, which indicates a duty cycle for the analog output. The comparator circuit produces an output approximately having the indicated duty cycle.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 is a block diagram representation of a pulse width modulation (PWM) circuit;

FIG. 2 is a table of digital count words and corresponding reversed order count words;

FIG. 3A shows exemplary outputs from the PWM circuit;

FIG. 3B shows exemplary outputs from a conventional PWM circuit;

DETAILED DESCRIPTION OF THE PREFERRED EMBODIMENTS

Figure 4:
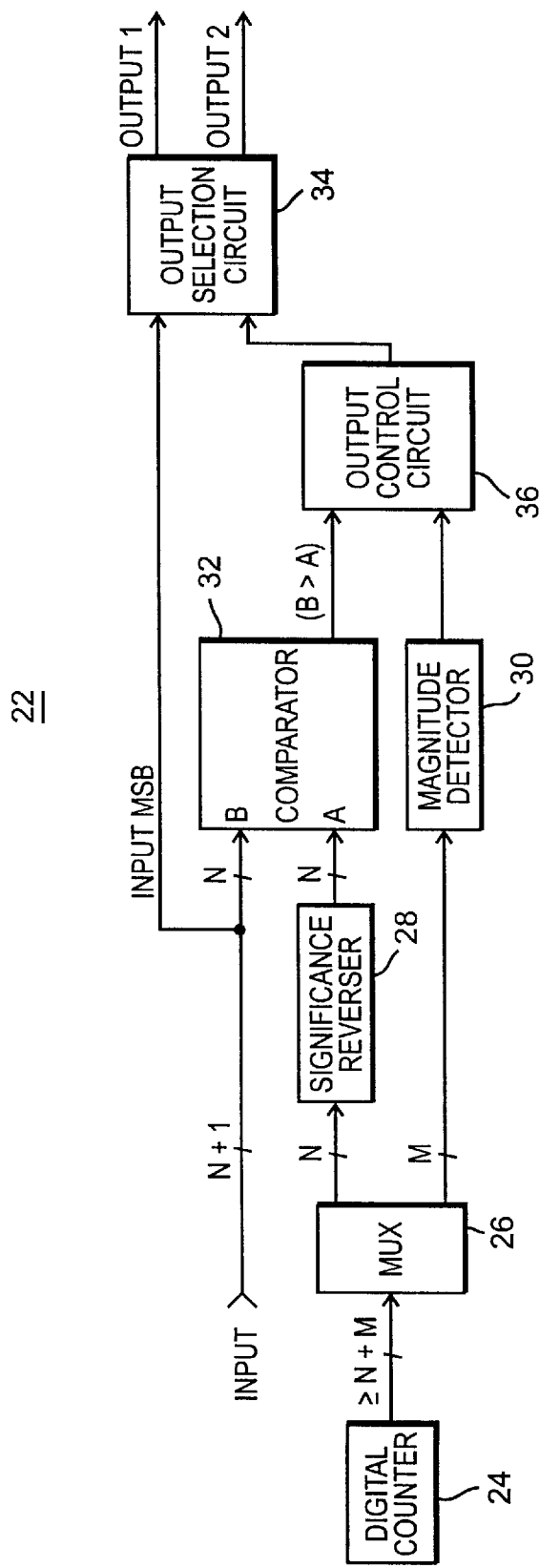
FIG. 4 is a block diagram representation of an alternate PWM circuit.

FIG. 1 is a block diagram representation of a pulse width modulation (PWM) circuit 10 in accordance with the present invention. PWM circuit 10 translates digital data input into an analog signal output, and may be used in numerous systems where such functionality is required. Briefly, PWM circuit 10 includes at least a digital counter 12, a significance reverser 14, and a comparator circuit 16. Those skilled in the art will appreciate that the various elements described herein can be realized as one or more discrete components, such as an application specific integrated circuit (ASIC) chip. In addition, conventional digital processing components well known to those skilled in the art are not shown or described herein.

Counter 12 is configured to produce a plurality of digital count words, each having at least two bits. Counter 12 sequentially counts from a first value (e.g., 0000) to a last value (e.g., 1111), preferably in a conventional manner. However, nothing requires counter 12 to count through all of the available bit combinations. Counter 12 may include any number of count bits, and PWM circuit 10 need not utilize all of the count bits generated by counter 12. As shown in FIG. 1, N bits from counter 12 are utilized by PWM circuit 10, where $N \geq 2$.

For purposes of this description, a count cycle refers to the time required for counter 12 to count from the first value to the last value. Consequently, the length of the count cycle in time is dependent upon the digital clock rate of PWM circuit 10 and the bit resolution of counter 12. Counter 12 and comparator 16 may receive a common timing clock signal generated by an external timing reference (not shown).

The output of counter 12 is coupled to significance reverser 14, which reverses the relative order of significance of at least two of the digital count word bits. The digital count word has at least a first bit and a second bit, where the first bit is of higher significance relative to the second bit, and the significance reverser "rearranges" the first and second bits such that the second bit is of higher significance relative to the first bit.

In the preferred embodiment, significance reverser 14 reverses the order of significance of all of the digital count word bits. Each N-bit count word is reversed to produce an associated reversed order count word. In the preferred embodiment, significance reverser 14 is realized by hard wiring the output of counter 12 to the input of comparator 16 in reverse order, i.e., the most significant bit (MSB) of a count word becomes the least significant bit (LSB) of a corresponding reversed order count word and the LSB of the count word becomes the MSB of the corresponding reversed order count word. Although significance reverser 14 is preferably realized by a specific arrangement of electronic connections, it may be alternately realized by one or more discrete components if necessary.

FIG. 2 is a table of standard digital count words, exemplary reversed order count words, and the corresponding magnitudes of the standard and reversed order count words. The reversed order count words in FIG. 2 are generated when all of the count word bits are reversed. For a 4-bit counter, the standard count sequence proceeds from 0 to 15, as shown. On the other hand, the corresponding reversed order count sequence proceeds as follows: 0, 8, 4, 12 . . . 11, 7, 15. FIG. 2 shows how the standard count word bits are reversed to obtain the reversed order count words.

Comparator 16 is coupled to significance reverser 14 such that it receives the reversed order count words as a first input (labeled A). Comparator 16 also receives a digital input word as a second input (labeled B). In the preferred embodiment, the digital input word remains substantially constant during at least one count cycle. The digital input word may be generated in response to different operating parameters depending upon the specific application, and application-specific algorithms determine the current value of the input word. For example, a microprocessor in a digital data receiver can produce the digital input word in response to symbol tracking processes. PWM 10 may, in turn, translate the digital input word into an analog control signal that regulates a frequency reference.

Comparator 16 compares the magnitude of the reversed order count word to the magnitude of the digital input word using well known methodologies. In the preferred embodiment, comparator 16 generates a high output value when the magnitude of the digital input word is greater than the magnitude of the reversed order count word, i.e., B>A, and otherwise generates a low output value. Of course, comparator 16 may be configured to perform alternate mathematical operations to suit specific applications (e.g., $B \geq A$ or A<B). As a result of the comparison operation carried out by comparator 16, the output signal includes a number of pulses distributed substantially evenly in time during the count cycle. Although the analog output signal is produced by comparator 16, PWM 10 may alternatively include one or more distinct elements (not shown) that function to produce the output signal in response to the above comparison.

In the preferred embodiment, the digital input words and the reversed order count words include the same number of bits. The digital input words are configured to indicate a duty cycle for the analog output signal. For purposes of this description, "duty cycle" refers to the ratio of the number of clock pulses having a high output to the total number of clock pulses in one count cycle. Thus, during any given count cycle, PWM circuit 10 produces an analog output that approximately has the duty cycle indicated by the digital input word.

Referring to FIG. 3A, an exemplary output from PWM circuit 10 is illustrated FIG. 3B shows a corresponding output from a conventional PWM system. The output from PWM circuit 10 is indicated by the reference number 18 (FIG. 2A) and the conventional PWM output is indicated by the reference number 20 (FIG. 3B). For an input magnitude of eleven, PWM circuit 10 produces a high output value whenever the magnitude of the reversed order count word is less than eleven. Consequently, the analog output is at a high level for eleven clock pulses, and the output pulses are distributed substantially evenly in time during the count cycle. In contrast, the conventional PWM output is high for the first eleven clock pulses and low for the remaining five clock pulses.

As the input magnitude increases, PWM circuit 10 produces more high level output pulses during the count cycle. Regardless of the input value, PWM circuit 10 preferably maintains the spaced distribution of the output pulses as much as possible. In contrast, conventional PWM circuits produce only one output pulse per counter cycle.

Conventional PWM circuits introduce low frequency harmonics at frequencies near to the count cycle update frequency. These frequency harmonics can affect the accuracy of the symbol timing clock and can introduce unwanted bit errors in the output data. Thus, in applications where heavy output filtering cannot be tolerated, conventional PWM techniques may not be practical. On the other hand, harmonics in the output of PWM circuit 10 are spaced relatively far from the count cycle update frequency. In addition, the amplitude of noise located near to the update frequency is typically within a tolerable level.

PWM circuit 10 also reduces the amount of transport delay associated with the output signal. In other words, the average output level settles to an acceptable level early in the count cycle. Using the example of FIG. 3A, the average value of output 18 taken over the first two clock pulses is 2/2 (two output high pulses for two clock pulses). The corresponding error between this average value and the desired output value of 11/16 is 5/16. However, the average output value taken over four clock pulses is 12/16, and the corresponding error is only 1/16. The corresponding error after the eighth and sixteenth clock pulses is 1/16 and zero, respectively. In contrast, the error after two, four, eight, and sixteen clock pulses for the conventional PWM output 20 (FIG. 3B) is 5/16, 5/16, 5/16, and zero, respectively.

As demonstrated above, the output of conventional PWM systems does not quickly settle to an acceptable average value. Thus, an accurate determination of the desired output value may have to be delayed until an entire counter cycle has elapsed. Consequently, a determination of the output value based upon a time interval shorter than the counter cycle may be erroneous.

Referring to FIG. 4, an alternate PWM circuit 22 according to the present invention is schematically illustrated. PWM circuit 22 is configured such that the output gain of the analog signal is variable. A programmable output gain is desirable where a system switches between the output of PWM circuit 22 (which may have a high gain due to a high data rate) and the output of a second control circuit having a comparatively low gain. In addition to the selectable gain feature, PWM 22 includes an output interface for compatibility with conventional phase/frequency detector (PFD) output configurations.

PWM circuit 22 includes a digital counter 24 configured to produce digital count words having at least (N+M) bits. The output of counter 24 is coupled to a multiplexer circuit (MUX) 26, which separates each digital count word into a first word and a second word. MUX 26 is configured such that the value of M and/or the value of N is selectable via a control signal (not shown). It should be appreciated that the value of M may be selected and set according to anticipated system characteristics or periodically updated as necessary. In the preferred embodiment, the first word includes N bits of higher significance relative to the digital count word and the second word includes M bits of lower significance relative to the digital count word. The first word serves as an input to a significance reverser 28 and the second word serves as an input to a magnitude detector 30 (described below).

Significance reverser 28 performs the same function as significance reverser 14 (described above in connection with FIG. 1). The output of significance reverser 28 is coupled to a comparator circuit 32, which receives the N-bit reversed order count words as a first input (labeled A). Comparator 32 also receives N bits from a digital input word as a second input (labeled B). The digital input word includes (N+1) bits, and the MSB of the digital input word is isolated for input into an output selection circuit 34 (described below). As such, the N remaining bits are utilized by comparator 32. The operation of comparator 32 is similar to the operation of comparator 16, and comparator 32 produces a pulsed analog output in the manner described above.

The output of comparator 32 is coupled to an output control circuit 36. The output of magnitude detector 30 is also coupled to output control circuit 36. Magnitude detector 30 is configured to detect when the magnitude of the M-bit second word equals a predetermined value, e.g., zero in the preferred embodiment. Magnitude detector 30 employs digital logic techniques known to those skilled in the art. Magnitude detector 30 preferably produces a logic high output when the magnitude of the second word equals the predetermined value and produces a logic low output when the magnitude of the second word differs from the predetermined value. Output control circuit 36 is configured to pass the analog output from comparator 32 when it receives a logic high signal from magnitude detector 30. When the magnitude of the second word differs from the predetermined value, output control circuit 36 withholds the analog output. Although a practical output control circuit 36 may be configured with any number of different components, the preferred embodiment utilizes a logic AND gate.

MUX 26, magnitude detector 30, and output control circuit 36 cooperate to control the gain of the analog output signal. Depending upon the selected value of M, output control circuit 36 will provide the analog output to selection circuit 34 after a given number of clock pulses. In effect, output control circuit 36 distributes output pulses during an extended count cycle during which the count cycle for the reversed order count words is repeated at least twice. For example, assuming that the pulsed output shown in FIG. 3A is produced by comparator 32 and that M=4, output control circuit 36 will distribute the pulses over 256 clock pulses rather than 16 clock pulses. The gain of the analog output is effectively reduced by a factor of $2^M$ by distributing the high output values over the longer extended count cycle.

Output control circuit 36 is coupled to selection circuit 34. Selection circuit 34 is configured to mimic conventional PFD outputs, which typically include PUMP UP and PUMP DOWN outputs that drive one or more charge pumps. Of course, selection circuit 34 may be alternatively configured according to specific system requirements.

Selection circuit 34 provides the analog signal to one of a plurality of output points (labeled OUTPUT1 and OUTPUT2) in response to the MSB of the digital input word. As discussed above, the MSB is isolated and routed to selection circuit 34. In the preferred embodiment, the MSB functions as a sign bit, and its value determines whether the analog signal is provided to OUTPUT1 or OUTPUT2. Depending upon specific system requirements, OUTPUT1 and OUTPUT2 may be configured to drive a differential charge pump or a single ended charge pump. Those skilled in the art will recognize that selection circuit 34 may include conventional switches, multiplexers, or other digital components.

Figure 5:
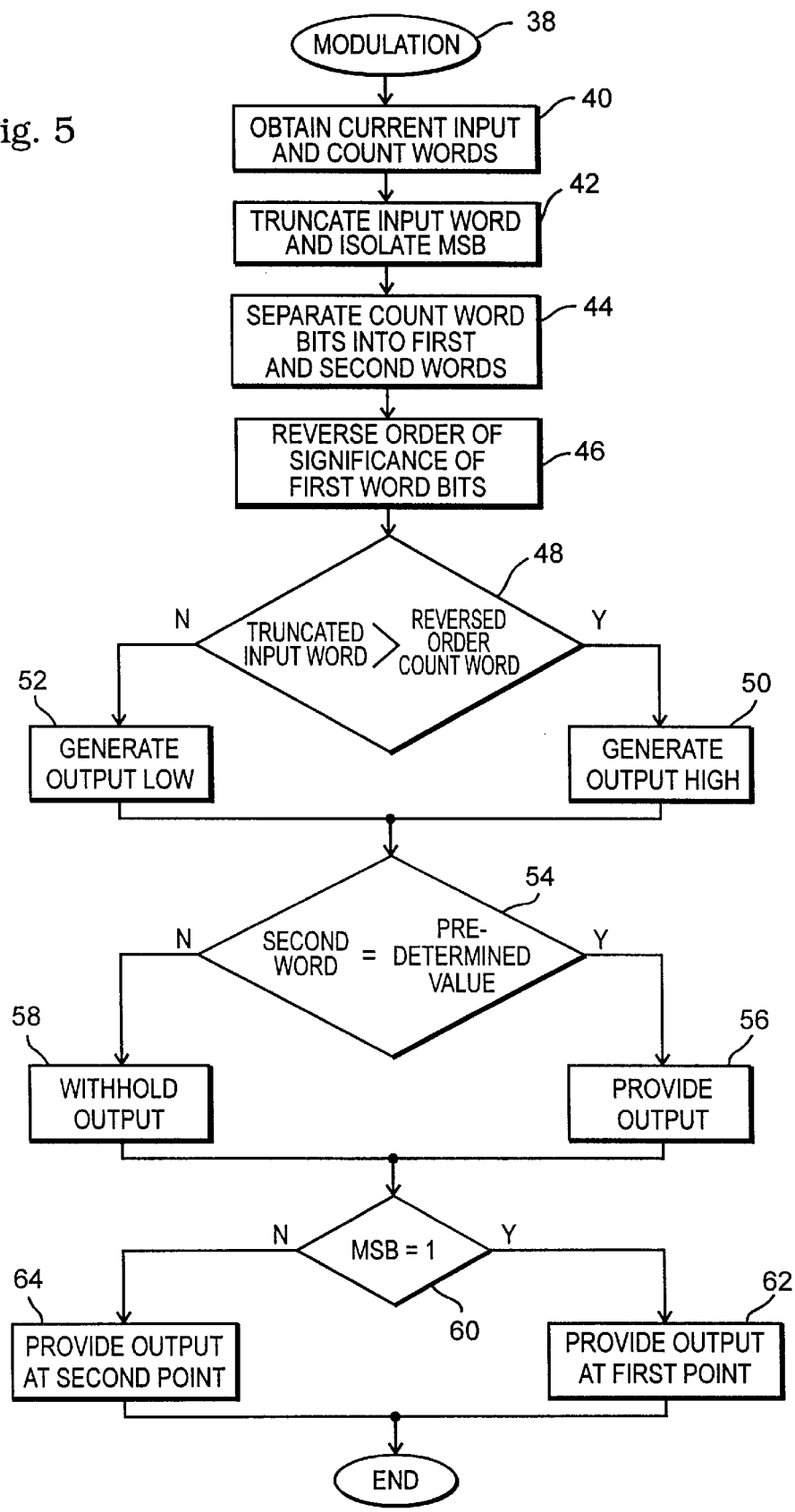
FIG. 5 is a flow diagram of a modulation process performed by the alternate PWM circuit.

With reference to FIG. 5, a modulation process 38 performed by PWM circuit 22 is illustrated as a flow diagram. Process 38 is preferably performed after a desired value for M has been selected to adjust the output gain of PWM circuit 22. For the sake of clarity, process 38 is described herein as it applies to a single digital count word established during one clock pulse. Those skilled in the art will realize that process 38 is repeated as counter 24 sequentially counts through the count cycle. In addition, the digital input word may be updated after completion of at least one count cycle.

Modulation process 38 begins with a task 40, which obtains the current digital input word and the current digital count word. As discussed above, the input word may be generated by a digital microprocessor according to system specifications, and the count word is generated by counter 24 (see FIG. 4). After task 40, a task 42 truncates the input word and isolates the MSB of the input word. Task 42 may be inherently performed by PWM circuit 22, depending upon how the various digital components are arranged and interconnected.

A task 44 separates the count word bits into a first word having at least two bits and a second word. As described above, MUX 26 (or an equivalently functioning circuit) performs task 44. Task 44 is preferably responsive to the value of M previously selected. As described above, the first word preferably includes N higher order bits and the second word preferably includes M lower order bits, where counter 24 generates words having at least (N+M) bits.

Following task 44, a task 46 reverses the order of significance of at least two (and preferably all) of the bits in the first word. As described above, significance reverser 28 performs task 46. Task 46 transforms the first word into a reversed order count word having N bits. Following task 46, a query task 48 is initiated.

Query task 48 is preferably performed by comparator 32, which determines whether the magnitude of the truncated input word is greater than the magnitude of the reversed order count word. If query task 48 determines that the magnitude of the truncated input word exceeds the magnitude of the reversed order count word, then a task 50 generates a first analog value for the output. If query task 48 determines otherwise, then a task 52 generates a second analog value for the output. In the preferred embodiment, the first and second values correspond to high and low values, respectively.

Following either task 50 or 52, magnitude detector 30 performs a query task 54 to determine whether the magnitude of the second word equals a predetermined value. Although the predetermined value can be selected according to individual applications, the preferred embodiment uses zero as a convenient value. If query task 54 determines that the magnitude of the second word equals the predetermined value, then a task 56 provides the high or low value as an output. If, however, the magnitude of the second word differs from the predetermined value, then a task 58 withholds the output. Tasks 58 and 60 are preferably performed by output control circuit 36 (described above).

After either task 56 or task 58 is performed, a query task 60 analyzes the MSB of the input word (isolated in task 42). If the MSB=1, then a task 62 provides the current output at a first output point. If query task 60 determines that the MSB=0, then a task 64 provides the current output at a second output point. Query task 60, task 62, and task 64 are performed by output selection circuit 34. In the preferred embodiment, the MSB is utilized as a sign bit and the two output channels of output selection circuit 34 are configured to mimic the output interface of a conventional phase/frequency detector circuit. For example, one output channel can provide a positive drive signal (pump up) to a charge pump and the other output channel can provide a negative drive signal (pump down) to the charge pump. The negative drive signal can be realized by inverting the output according to known techniques.

Following either task 62 or task 64, modulation process 38 ends. As discussed above, process 38 is preferably repeated for each count word generated by counter 24. As process 38 is repeated during the count cycle of counter 24, PWM circuit 22 produces an analog signal having a number of high output pulses evenly spread during the count cycle. The digital input value (which controls the duty cycle of the analog output) may be updated at a rate approximately equal to one count cycle or an integral multiple thereof.

In summary, the present invention provides an improved digital PWM circuit that translates digital data into an analog signal. The PWM circuit is easy to implement in an all-digital environment and economical to use in systems that process both digital and analog signals. In comparison to conventional PWM circuits, the improved PWM circuit generates less harmonic components near its digital counter update frequency. A PWM circuit according to the present invention produces an analog signal having an average output level that can be adequately determined early in the digital counter cycle. In addition, a PWM circuit according to a preferred embodiment of the present invention may be programmed such that the output gain approximates the output gain of an external circuit.

The above description is of preferred embodiments of the present invention, and the invention is not limited to the specific embodiment described and illustrated. For example, the bit resolution and other operating parameters of the various digital components may be selected to suit the specific applications. In addition, the processing tasks described herein need not be performed in any specific order, and an embodiment of the present invention need not carry out all of the described process tasks. Furthermore, many variations and modifications will be evident to those skilled in this art, and such variations and modifications are intended to be included within the spirit and scope of the invention, as expressed in the following claims.

What is claimed is:

1. A pulse width modulation method for translating digital data into an analog signal, said method comprising the steps of:

(a) obtaining a digital input word and a digital count word, said digital count word having at least a first bit and a second bit, said first bit being of higher significance relative to said second bit;

(b) separating each of said digital count word bits into a first word and a second word, wherein said first word has at least two bits;

(c) reversing the relative order of significance of said first and second bits of said first word to produce a reversed order count word;

(d) generating a first analog value for an output when the magnitude of said digital input word is greater than the magnitude of said reversed order count word;

(e) generating a second analog value for said output when the magnitude of said digital input word is not greater than the magnitude of said reversed order count word;

(f) providing said output when the magnitude of said second word equals a predetermined value; and (g) withholding said output when the magnitude of said second word differs from said predetermined value.

2. A method according to claim 1, wherein:

said step (a) obtains a plurality of digital count words in sequential order; and said steps (b), (c), (d), and (e) are repeated for each of said plurality of digital count words.

3. A method according to claim 2, wherein:

said plurality of digital count words are generated by a digital counter that sequentially counts from a first value to a last value during a count cycle; and said output includes a number of pulses distributed substantially evenly in time during said count cycle.

4. A method according to claim 1, wherein:

said digital count word has at least (N+M) bits, said first word includes N bits of higher significance relative to said digital count word, and said second word includes M bits of lower significance relative to said digital count word; and said method further comprises the step of selecting a value for M according to an output gain.

5. A method according to claim 1, wherein said digital input word and said reversed order count word include the same number of bits.

6. A method according to claim 1, wherein:

said digital count word is generated by a digital counter that sequentially counts from a first value to a last value during a count cycle; and said digital input word remains substantially constant during said count cycle.

7. A pulse width modulation method for translating digital data into an analog signal, said method comprising the steps of:

(a) obtaining a digital input word and a digital count word, said digital count word having at least a first bit and a second bit, said first bit being of higher significance relative to said second bit, wherein said digital input word has (N+1) bits, and said digital count word has N bits;

(b) reversing the relative order of significance of said first and second bits to produce a reversed order count word;

(c) isolating the most significant bit (MSB) of said digital input word;

(d) generating a first analog value for an output when the magnitude of said digital input word is greater than the magnitude of said reversed order count word;

(e) generating a second analog value for said output when the magnitude of said digital input word is not greater than the magnitude of said reversed order count word; and (f) providing said output at one of a plurality of points in response to said MSB.

8. A pulse width modulation method for translating digital data into an analog signal, said method comprising the steps of:

(a) sequentially counting from a first digital value to a last digital value during a count cycle;

(b) obtaining a digital input word configured to indicate a duty cycle and a plurality of digital count words, each of said digital count words having a plurality of bits;

(c) separating each of said digital count word bits into a first word and a second word, wherein said first word has at least two bits;

(d) reversing, for each of said digital count words, the relative order of significance of at least two of said digital count word bits to produce a plurality of reversed order count words;

(e) comparing the magnitude of each of said reversed order count words to the magnitude of said digital input word;

(f) producing an output in response to said comparing step (e), said output approximately having said duty cycle and said output including a number of pulses distributed substantially evenly in time during said count cycle;

(g) providing said output when the magnitude of said second word equals a predetermined value; and (h) withholding said output when said magnitude of said second word differs from said predetermined value.

9. A method according to claim 8, further comprising the step of distributing said number of pulses substantially evenly in time during an extended count cycle, wherein said count cycle is repeated at least twice during said extended count cycle.

10. A method according to claim 8, wherein:

each of said digital count words has at least (N+M) bits, said first word includes N bits of higher significance relative to said digital count word, and said second word includes M bits of lower significance relative to said digital count word; and said method further comprises the step of selecting a value for M according to an output gain.

11. A method according to claim 8, wherein for each of said reversed order count words said step f comprises the steps of:

generating a first analog value for said output when the magnitude of said digital input word is greater than the magnitude of said reversed order count word; and generating a second analog value for said output when the magnitude of said digital input word is not greater than the magnitude of said reversed order count word.

12. A pulse width modulation method for translating digital data into an analog signal, said method comprising the steps of:

(a) sequentially counting from a first digital value to a last digital value during a count cycle;

(b) obtaining a digital input word configured to indicate a duty cycle and a plurality of digital count words, wherein said digital input word has (N+1) bits, and each of said digital count words has N bits;

(c) reversing, for each of said digital count words, the relative order of significance of at least two of said digital count word bits to produce a plurality of reversed order count words;

(d) comparing the magnitude of each of said reversed order count words to the magnitude of said digital input word;

(e) isolating the most significant bit (MSB) of said digital input word;

(f) producing an output in response to said comparing step (d), said output approximately having said duty cycle, and said output including a number of pulses distributed substantially evenly in time during said count cycle; and (g) providing said output at one of a plurality of points in response to said MSB.

13. A pulse width modulation circuit that translates digital data into an analog signal, said circuit comprising:

a digital counter configured to produce a plurality of digital count words, each of said digital count words having a plurality of bits;

means for reversing the relative order of significance of at least two of said digital count word bits to produce a corresponding plurality of reversed order count words, said means for reversing being coupled to said digital counter;

a comparator circuit coupled to said means for reversing, said comparator circuit being configured to compare the magnitude of each of said reversed order count words to the magnitude of a digital input word that indicates a duty cycle;

means for producing an output approximately having said duty cycle;

a selection circuit coupled to said means for producing, wherein:

said digital input word has (N+1) bits and each of said digital count words has N bits; and said selection circuit is configured to provide said output at one of a plurality of points in response to the most significant bit (MSB) of said digital input word.

14. A pulse width modulation circuit according to claim 13, wherein:

said digital counter sequentially counts from a first value to a last value during a count cycle;

said digital input word remains substantially constant during said count cycle; and said analog signal includes a number of pulses distributed substantially evenly in time during said count cycle.

15. A pulse width modulation circuit according to claim 15, wherein, for each of said reversed order count words, said means for producing generates a first analog value when the magnitude of said digital input word is greater than the magnitude of said reversed order count word, and generates a second analog value when the magnitude of said digital input word is not greater than the magnitude of said reversed order count word.

16. A pulse width modulation circuit that translates digital data into an analog signal, said circuit comprising:

a digital counter configured to produce a plurality of digital count words, each of said digital count words having a plurality of bits;

means for reversing the relative order of significance of at least two of said digital count word bits to produce a corresponding plurality of reversed order count words, said means for reversing being coupled to said digital counter;

a comparator circuit coupled to said means for reversing, said comparator circuit being configured to compare the magnitude of each of said reversed order count words to the magnitude of a digital input word that indicates a duty cycle;

means for producing an output approximately having said duty cycle;

measn for separating each of said digital count words into a first word and a second word, wherein said first word has at least two bits and the relative order of significance of said first word is reversed by said means for reversing;

a magnitude detector coupled to said means for seperating and configured to receive said second word; and a control circuit configured to provide said output when the magnitude of said second word equals a predetermined value, and to withhold said output when the magnitude of said second word differs from said predetermined value.

17. A pulse width modulation circuit according to claim 16, wherein:

each of said digital count words has at least (N+M) bits, said first word includes N bits of higher significance relative to said digital count word, and said second word includes M bits of lower significance relative to said digital count word; and said means for separating is configured to select a value for M according to an output gain.

* * * * *

UNITED STATES PATENT AND TRADEMARK OFFICE
CERTIFICATE OF CORRECTION

PATENT NO. : 5,774,084
DATED : 30 June 1998
INVENTOR(S) : Eric Martin Brombaugh, John Michael Liebetreu, and Ronald Duane McCallister It is certified that error appears in the above-indentified patent and that said Letters Patent is hereby corrected as shown below:

In Column 12, Line 14, please delete "measn" and insert --means-- therefor.

In Column 12, Line 19, please delete "seperating" and insert --separating-- therefor.

Signed and Sealed this

First Day of September, 1998

Attest:

BRUCE LEHMAN

*Attesting Officer*     *Commissioner of Patents and Trademarks*